(12) United States Patent
Tay et al.

(10) Patent No.: US 12,048,101 B2
(45) Date of Patent: Jul. 23, 2024

(54) COMPONENT CARRIER WITH WELL-DEFINED OUTLINE SIDEWALL CUT BY SHORT LASER PULSE AND/OR GREEN LASER

(71) Applicant: AT&S (China) Co. Ltd., Shanghai (CN)

(72) Inventors: Seok Kim Tay, Singapore (SG); Mikael Tuominen, Pernio (FI)

(73) Assignee: AT&S(China) Co. Ltd., Shanghai (CN)

( * ) Notice: Subject to any disclaimer, the term of this patent is extended or adjusted under 35 U.S.C. 154(b) by 199 days.

(21) Appl. No.: 17/445,331

(22) Filed: Aug. 18, 2021

(65) Prior Publication Data
US 2022/0061162 A1     Feb. 24, 2022

(30) Foreign Application Priority Data

Aug. 24, 2020  (CN) .......................... 202010859502.5

(51) Int. Cl.
*H05K 1/02*    (2006.01)
*B23K 26/38*   (2014.01)
(Continued)

(52) U.S. Cl.
CPC ........... *H05K 3/0032* (2013.01); *B23K 26/38* (2013.01); *H05K 3/4608* (2013.01); *B23K 2101/42* (2018.08); *H05K 2203/107* (2013.01)

(58) Field of Classification Search
CPC .......... H05K 1/02; H05K 1/0306; H05K 1/09; H05K 1/092; H05K 1/115; H05K 3/022; H05K 3/025; H05K 2203/107; B23K 26/38; B23K 2101/42; H10K 50/11; H10K 50/854; H10K 71/00; H10K 71/80;
(Continued)

(56) References Cited

U.S. PATENT DOCUMENTS 4,833,318 A * 5/1989 Yonekura ............... G01S 7/4811
                                                        250/239
5,563,234 A * 10/1996 Otto .......................... B32B 3/04
                                                        428/416
(Continued)

FOREIGN PATENT DOCUMENTS

CN  103857191 A   6/2014
CN  105472891 A   4/2016
(Continued)

OTHER PUBLICATIONS

Anon; Surface Roughness; as downloaded on Aug. 18, 2021 from https://en.wikipedia.org/wiki/Surface_roughness; pp. 1-15; Wikipedia. org.

(Continued)

*Primary Examiner* — Xiaoliang Chen
(74) *Attorney, Agent, or Firm* — Robert A. Blaha; Smith Tempel Blaha LLC

(57) ABSTRACT

A method of manufacturing a component carrier is described. The method includes forming a stack having at least one electrically conductive layer structure and/or at least one electrically insulating layer structure, and cutting out the component carrier from the stack along a closed circumferential laser cutting trajectory by a pulsed laser beam having a pulse length of less than 1 ns.

20 Claims, 4 Drawing Sheets

(51) Int. Cl.
*H01L 23/14* (2006.01)
*H01L 23/15* (2006.01)
*H05K 1/09* (2006.01)
*H05K 3/00* (2006.01)
*H05K 3/22* (2006.01)
*H05K 3/32* (2006.01)
*H05K 3/46* (2006.01)
*H10K 50/11* (2023.01)
*H10K 50/854* (2023.01)
*H10K 71/00* (2023.01)
*H10K 71/80* (2023.01)
*B23K 101/42* (2006.01)

(58) Field of Classification Search
CPC ..... H01L 23/14; H01L 23/15; H01L 23/3121; H01L 23/3157; H01L 23/3735; H01L 23/49531
USPC ..... 174/250; 428/141, 189, 192, 209, 301.4, 428/323, 414, 415, 416, 425.3, 457, 4, 428/60, 607, 612, 666, 675, 687, 688, 428/935; 438/10, 80
See application file for complete search history.

(56) References Cited

U.S. PATENT DOCUMENTS

| | | | | |
|---|---|---|---|---|
| 6,177,234 B1* | 1/2001 | Metzger | | G03F 3/103 430/293 |
| 6,371,615 B1* | 4/2002 | Schweitzer | | A61B 3/10 351/221 |
| 8,475,506 B1* | 7/2013 | Bendett | | A61N 5/0622 607/88 |
| 9,786,434 B2* | 10/2017 | Choi | | H01G 4/30 |
| 10,182,942 B2* | 1/2019 | Reich | | A61B 3/1025 |
| 2001/0008680 A1* | 7/2001 | Bergstedt | | H05K 3/387 428/209 |
| 2001/0026867 A1* | 10/2001 | Kayanoki | | B29C 33/424 264/510 |
| 2002/0029956 A1* | 3/2002 | Allen | | G03F 1/82 422/186 |
| 2002/0033387 A1 | 3/2002 | Kurosawa et al. | | |
| 2002/0036182 A1* | 3/2002 | Kajimoto | | B24B 37/042 216/99 |
| 2002/0075686 A1* | 6/2002 | Kosugi | | C23C 14/20 362/341 |
| 2003/0012975 A1* | 1/2003 | Gales | | C25D 3/38 428/666 |
| 2004/0030021 A1* | 2/2004 | Mitsunaga | | C08K 5/541 524/445 |
| 2004/0108612 A1* | 6/2004 | Yamaki | | B29C 44/585 264/45.2 |
| 2004/0121178 A1* | 6/2004 | Suzuki | | C25D 1/04 428/666 |
| 2004/0246609 A1* | 12/2004 | Quenzer | | G02B 27/0927 359/883 |
| 2005/0236378 A1 | 10/2005 | Boyle et al. | | |
| 2005/0245625 A1* | 11/2005 | Miyazaki | | B29C 44/0407 521/50 |
| 2005/0272183 A1* | 12/2005 | Lukacs | | B06B 1/0622 438/109 |
| 2006/0169869 A1* | 8/2006 | Jimbo | | B29C 33/44 249/134 |
| 2006/0262815 A1* | 11/2006 | Klimov | | H01S 3/1075 372/18 |
| 2007/0053812 A1* | 3/2007 | Kawai | | B81C 99/008 249/176 |
| 2007/0184662 A1* | 8/2007 | Yamashita | | B24B 37/28 438/692 |
| 2007/0190310 A1* | 8/2007 | Yusa | | B29C 37/0082 428/323 |
| 2007/0222339 A1* | 9/2007 | Lukacs | | B06B 1/0622 310/334 |
| 2008/0063838 A1* | 3/2008 | Kurihara | | H05K 3/383 428/141 |
| 2009/0050990 A1* | 2/2009 | Aono | | G01P 1/023 438/51 |
| 2009/0057705 A1* | 3/2009 | Takashima | | H01L 23/14 257/E21.575 |
| 2009/0086603 A1* | 4/2009 | Kuroda | | G11B 7/128 369/100 |
| 2009/0109809 A1* | 4/2009 | Kuroda | | G11B 7/1263 |
| 2009/0224172 A1* | 9/2009 | Scholz | | A61B 5/0071 250/459.1 |
| 2009/0305615 A1* | 12/2009 | Uchiyama | | B24B 37/28 451/57 |
| 2010/0090108 A1* | 4/2010 | Hoeche | | G01N 1/286 250/311 |
| 2010/0141729 A1* | 6/2010 | Petsch | | B41M 5/267 347/225 |
| 2010/0156244 A1* | 6/2010 | Lukacs | | B06B 1/0622 29/25.35 |
| 2011/0034911 A1* | 2/2011 | Bischoff | | A61F 9/009 606/4 |
| 2011/0186900 A1* | 8/2011 | Watari | | H01L 24/97 257/E33.059 |
| 2011/0274888 A1* | 11/2011 | Tang | | C04B 37/028 977/734 |
| 2012/0152594 A1* | 6/2012 | Sheffield | | H05K 1/0242 174/250 |
| 2013/0064262 A1* | 3/2013 | Kopf | | H01S 5/183 372/39 |
| 2013/0140955 A1* | 6/2013 | Chaggares | | H10N 30/063 310/334 |
| 2013/0175701 A1* | 7/2013 | Park | | H01L 22/12 257/774 |
| 2013/0207519 A1* | 8/2013 | Chaggares | | H10N 30/50 216/13 |
| 2014/0052113 A1* | 2/2014 | Kuehnert | | A61F 9/00825 606/6 |
| 2014/0138359 A1* | 5/2014 | Carr | | C03C 23/0025 219/121.8 |
| 2014/0182786 A1 | 7/2014 | Finn | | |
| 2014/0349137 A1* | 11/2014 | Brandl | | 428/141 |
| 2014/0356578 A1* | 12/2014 | Brandl | | B23K 26/1224 428/141 |
| 2015/0025510 A1* | 1/2015 | Vogler | | A61F 9/00825 606/4 |
| 2015/0137294 A1* | 5/2015 | Wang | | H01L 27/14687 257/431 |
| 2015/0166397 A1 | 6/2015 | Marjanovic et al. | | |
| 2015/0202807 A1* | 7/2015 | Sano | | B29C 43/20 428/688 |
| 2015/0303111 A1 | 10/2015 | Lei et al. | | |
| 2015/0312554 A1* | 10/2015 | Banks | | G01S 7/499 348/50 |
| 2015/0367558 A1* | 12/2015 | Brandl | | B23K 26/3584 264/400 |
| 2015/0371966 A1* | 12/2015 | Yoshida | | H01L 24/05 257/620 |
| 2015/0375341 A1* | 12/2015 | Chan | | B23K 26/362 264/400 |
| 2016/0004349 A1* | 1/2016 | Prieto Rio | | B23K 26/40 29/622 |
| 2016/0168396 A1* | 6/2016 | Letocart | | C09D 5/24 359/275 |
| 2016/0212836 A1* | 7/2016 | Arai | | C22C 9/04 |
| 2016/0212846 A1* | 7/2016 | Kohiki | | H05K 3/205 |
| 2016/0212857 A1* | 7/2016 | Miyoshi | | C25D 7/0614 |
| 2016/0225721 A1* | 8/2016 | Choi | | H01L 24/00 |
| 2016/0338194 A1 | 11/2016 | Han et al. | | |
| 2016/0338836 A1* | 11/2016 | Sonnleitner | | A61F 2/2803 |
| 2017/0018730 A1* | 1/2017 | Popp | | H10K 50/814 |
| 2017/0020634 A1* | 1/2017 | Sonnleitner | | A61C 8/0074 |
| 2017/0072734 A1* | 3/2017 | Lochbihler | | B42D 25/328 |
| 2017/0092804 A1* | 3/2017 | Peng | | H01L 33/0095 |
| 2017/0143492 A1* | 5/2017 | Sonnleitner | | A61F 2/2846 |
| 2018/0134059 A1* | 5/2018 | Adamson | | B41N 3/032 |

(56) References Cited

U.S. PATENT DOCUMENTS

| | | | |
|---|---|---|---|
| 2018/0166354 A1 | 6/2018 | Imayoshi | |
| 2018/0254216 A1 | 9/2018 | Scanlan et al. | |
| 2019/0006811 A1* | 1/2019 | Scholz-Riecke | H01S 3/0617 |
| 2019/0099243 A1* | 4/2019 | Sonnleitner | A61F 2/2846 |
| 2019/0115714 A1* | 4/2019 | Shen | H01S 3/0635 |
| 2019/0164940 A1* | 5/2019 | Zhang | H01L 33/56 |
| 2019/0326491 A1* | 10/2019 | Koike | H01L 33/52 |
| 2019/0327831 A1* | 10/2019 | Kato | H01L 23/49531 |
| 2020/0036152 A1* | 1/2020 | Budnicki | H01S 3/06754 |
| 2020/0083132 A1* | 3/2020 | Huang | H01L 21/568 |
| 2020/0194638 A1* | 6/2020 | Kikuchi | H01L 33/52 |
| 2020/0215648 A1* | 7/2020 | Swoboda | B23K 26/146 |
| 2020/0243799 A1* | 7/2020 | Qu | H10K 50/11 |
| 2020/0398372 A1* | 12/2020 | Rogg | C04B 37/021 |
| 2021/0246304 A1* | 8/2021 | Hino | B29C 45/0013 |
| 2021/0301988 A1* | 9/2021 | Boesl | H01L 25/0753 |
| 2022/0022326 A1* | 1/2022 | Ishii | H05K 3/388 |
| 2022/0048133 A1* | 2/2022 | Specht | B23K 26/3584 |
| 2022/0145025 A1* | 5/2022 | Mitsuoka | B29C 66/72143 |
| 2022/0145061 A1* | 5/2022 | Matsumura | C08F 8/22 |
| 2022/0153983 A1* | 5/2022 | Matsumura | C09D 127/24 |
| 2022/0195088 A1* | 6/2022 | Imamura | H01M 50/426 |

FOREIGN PATENT DOCUMENTS

| | | |
|---|---|---|
| CN | 106029293 A | 10/2016 |
| CN | 106457476 A | 2/2017 |
| CN | 106536119 A | 3/2017 |
| CN | 107665877 | 2/2018 |
| CN | 111508923 A | 8/2020 |
| CN | 111564414 A | 8/2020 |
| TW | 200914189 A | 4/2009 |

OTHER PUBLICATIONS

Anon; Color; as downloaded on Aug. 18, 2021 from https://en.wikipedia.org/wiki/Color; pp. 1-28; Wikipedia.org.

Anon; Photosynthesis (H) as downloaded from http://dmucklow.weebly.com/topic-29.html on Aug. 18, 2021; pp. 1-9; Dmucklow.weebly.com.

Chui, H et al.; Picosecond Lasers Transform vol. Manufacturing; as downloaded from https://www.photonics.com/Articles/Picosecond_Lasers_Transform_Volume_Manufacturing/a64666 on Aug. 18, 2021; pp. 1-13; Photonics.com.

Office Action Issued in Application No. 202010859502.5; pp. 1-10; Jul. 1, 2023; pp. 1-10; China National Intellectual Property Administration, No. 6, Xitucheng Lu, Jimenqiao Haidian District, Beijing City, China.

Second Office Action in Application No. 202010859502.5; pp. 1-9; Apr. 1, 2024; China National Intellectual Property Administration, The State Intellectual Property Office of the People's Republic of China; No. 6, Xitucheng Lu, Jimenqiao Haidian District, Beijing City, 100088, China P.R.

English Translation of Second Office Action in Application No. 202010859502.5; pp. 1-12; Apr. 1, 2024; China National Intellectual Property Administration, The State Intellectual Property Office of the People's Republic of China; No. 6, Xitucheng Lu, Jimenqiao Haidian District, Beijing City, 100088, China P.R.

* cited by examiner

COMPONENT CARRIER WITH WELL-DEFINED OUTLINE SIDEWALL CUT BY SHORT LASER PULSE AND/OR GREEN LASER

TECHNICAL FIELD

Embodiments of the invention generally relate to methods of manufacturing a component carrier, and to a component carrier.

TECHNOLOGICAL BACKGROUND

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

In many cases, component carriers, such as printed circuit boards, are manufactured on panel level, wherein a finally manufactured component carrier may be cut out from a panel at the end of the manufacturing process for singularization. Conventionally, this may be accomplished for example by mechanically sawing or by laser cutting.

However, structural artifacts may occur at cutting edges of component carriers.

SUMMARY

There may be a need for a component carrier which can be manufactured in a reliable and precise way without structural artifacts at a sidewall edge of the component carrier.

According to an exemplary embodiment of the invention, a method of manufacturing a component carrier is provided, wherein the method comprises forming a stack comprising at least one electrically conductive layer structure and/or at least one electrically insulating layer structure, and cutting out the component carrier from the stack along a closed circumferential laser cutting trajectory (or path) by a pulsed laser beam having a pulse length of less than 1 ns.

According to another exemplary embodiment of the invention, a meth-od of manufacturing a component carrier is provided, wherein the method comprises forming a stack comprising at least one electrically conductive layer structure and/or at least one electrically insulating layer structure, and cutting out the component carrier from the stack along a closed circumferential laser cutting trajectory (or path) by a green laser beam.

According to another exemplary embodiment of the invention, a com-ponent carrier is provided, wherein the component carrier comprises a stack comprising at least one electrically conductive layer structure and/or at least one electrically insulating layer structure, wherein an entire outline sidewall of the stack has a roughness Rz (or alternatively a roughness Ra) of not more than 20 µm.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another. The layer structures of the stack may be connected by lamination, i.e. the application of heat and/or pressure.

In the context of the present application, the term "layer structure" may particularly denote a continuous layer, a patterned layer, or a plurality of non-consecutive islands within a common plane.

In the context of the present application, the term "pulsed laser beam" may particularly denote a beam of substantially monochromatic electromagnetic radiation created by a laser source configured for being operable in a pulsed mode. Pulsed operation of a laser source may refer to any laser source which is not operated as continuous wave, but in contrast to this the optical power is emitted as a sequence of pulses of pre-defined duration at a predefined repetition rate. For instance, a pulsed laser beam may be com-posed of temporally separated laser pulses having a large energy being highly appropriate for cutting a layer stack of a component carrier to be manufactured.

In the context of the present application, the term "pulse length" or pulse duration may particularly denote the time interval between a point of time at which the amplitude (for instance intensity) of the laser pulse reaches a specified fraction or level of its maximum amplitude, and a later point of time at which the pulse amplitude drops to the same level. In particular, the time interval between the 50% points of the maximum amplitude can be used to determine or define pulse length or pulse duration.

In the context of the present application, the term "green laser beam" may particularly denote a laser beam comprising visible light of green color. This may correspond to a wavelength of the laser beam in a range from 492 nm to 577 nm, and in particular in a range from 520 nm to 560 nm. Such a green laser beam may or may not be pulsed.

In the context of the present application, the term "outline sidewall" may particularly denote a slanted or even vertical circumferential surface area of a planar or substantially planar component carrier. The outline sidewall may define an exterior lateral outline, circumference or perimeter of the component carrier.

In the context of the present application, the term "roughness Rz" or surface roughness Rz may particularly denote the roughness of a surface defined as and measured as average roughness depth Rz. Rz can be determined when a reference length is sampled from a roughness curve in a direction of a mean line, and may denote the distance between the top profile peak line and the bottom profile valley line on this sampled portion as measured in the longitudinal direction of the roughness curve (for instance, Rz may be determined by averaging over five or ten individual measuring paths). Alternatively, the roughness of a surface may be defined as and may be measured as the centerline average height Ra. Ra is the arithmetic mean value of all distances of the profile from the centerline. For instance, the measurement or determination of roughness Rz or Ra may be carried out according to DIN EN ISO 4287:1984.

According to an exemplary embodiment of the invention, singularization of one or more component carriers from a stack or component carrier structure (such as a panel or an array) may be carried out by cutting out a respective component carrier from the stack by a laser beam with a highly advantageous pulse length and/or at a highly advantageous wavelength. When cutting with the laser along a closed laser cutting loop defining the entire outline of the cut out component carrier by said laser processing, a precisely and artifact-free outline with homogeneous and smooth surface properties may be obtained.

According to one aspect, such as a laser beam may be pulsed with a pulse duration below a nanosecond level, i.e. in the sub-nanosecond range and preferably in the picosecond range. It has turned out that such short and high energy laser pulses are particularly appropriate for obtaining a smooth cutting edge with low roughness, a low level of carbonization at the cutting edge, and a low tendency of glass fibers or the like extending laterally beyond the cut outline area. At the same time, using a laser pulse with a pulse length below 1 ns allows for a rapid cutting and hence a high throughput, as well as an efficient use of the available stack area.

According to another aspect, which may or may not be combined with the previously described aspect, a laser emitting (substantially monochromatic) green light may be used for cutting out a respective component carrier from a stack. Such a green light laser has turned out to be particularly appropriate for obtaining a smooth cutting edge with low roughness and with a remarkably low level of carbonization at the cut sidewall of the component carrier. Simultaneously, quick and efficient cutting on an industrial scale and with high yield may be achieved.

In the following, further exemplary embodiments of the methods and the component carrier will be explained.

In an embodiment, said stack may be a component carrier structure. In the context of the present application, the term "component carrier structure" may particularly denote a preform of component carriers being presently manufactured. In particular, the component carrier structure may comprise a plurality of still integrally connected component carriers or preforms thereof which may be manufactured in a batch process before being singularized. In particular, a component carrier structure may be a panel (for example having a dimension of 18 inch×24 inch, or larger), or an array (of for instance six component carriers being presently manufactured). For example, the manufactured component carriers may be printed circuit boards or integrated circuit (IC) substrates. By making use of the above provisions during laser cutting, singularization of component carriers from a component carrier structure such as a panel may be realized with high accuracy and high throughput.

In an embodiment, the pulsed laser beam has a pulse length in a temporal range from 1 ps to 100 ps. In particular, the pulsed laser beam may have a pulse length of not more than 10 ps. Descriptively speaking, such short laser pulses are considered to provide sufficient energy impact on the stack material to be cut by burning away organic stack material, while simultaneously giving the surrounding material of the stack the chance to cool down or to stay at a sufficiently low temperature between subsequent picosecond laser pulses to thereby prevent or at least strongly suppress carbonization of organic stack material such as resin.

In an embodiment, the method may comprise generating the laser beam by a picosecond laser source. Picosecond lasers may be lasers that generate ultra-short light pulses in the range of picoseconds (in particular having a pulse duration in a range between 1 ns and 1 ps). The short pulse duration of picosecond lasers during the removal of stack material for singularizing a component carrier may cause stack material to be burnt more strongly than with nanosecond lasers and thus cut more quickly and completely. In addition, such a picosecond laser may introduce less heat to the stack during treatment, thereby reducing or even minimizing the risk of the formation of artefacts the exterior sidewall of the component carrier.

In another embodiment, the method comprises generating the laser beam by a femtosecond laser, i.e. emitting pulses with pulse durations in the order of magnitude of $10^{-15}$ s. Hence, femtosecond lasers may be lasers that emit light pulses with a pulse length or duration in the femtosecond range. Femtosecond lasers may compress energy via mode coupling into an extremely short time range, and therefore may have significantly higher peak outputs. These short pulse durations can be achieved in particular via nonlinear effects, for example via the Kerr effect. In yet another embodiment, the method comprises generating the laser beam by an attosecond laser source, which may emit still shorter pulse durations in the order of magnitude of $10^{-18}$ s. The suppression of carbonization and the smoothing of an outline sidewall of a laser cut component carrier, while achieving high accuracy and high speed of the laser separation, renders femtosecond and attosecond lasers also highly appropriate for component carrier singularization.

In an embodiment, the method comprises generating the pulsed laser beam with a pulse length below 1 ns by a carbon dioxide ($CO_2$) laser or an ultraviolet (UV) laser. Although a green laser may be preferred as described herein, picosecond laser pulses created by a $CO_2$ or a UV laser may also be capable of creating a smooth outline sidewall of the singularized PCB-type component carriers. More generally, a wavelength of the laser beam may be for instance in a range from 50 nm to 650 nm, in particular in a range from 450 nm to 600 nm, in particular when the pulse length is below 1 ns.

In an embodiment, the method comprises cutting out the component carrier from the stack by moving the laser beam multiple times along an outline of the component carrier, in particular in a plurality of closed loops. It has been found that, in order to obtain an outline sidewall with desired properties in terms of low roughness and low carbonization, it may be advantageous to keep a laser exposure to each individual PCB area sufficiently short so that the respective region does not heat up excessively. In order to achieve this goal, it has turned out to be highly advantageous to not cut out a component carrier by a single circumferential laser cut (which may however be made in other embodiments), but in contrast to this make a cut by moving the laser beam multiple times along the same trajectory to continuously deepen a groove in the stack formed by laser ablation so that finally the component carrier is separated from the stack, such as a panel-type component carrier structure. This may result in cold ablation avoiding undesired carbonization at the cutting edge.

Preferably, the method comprises cutting out the component carrier from the stack by moving the laser beam 10 times to 100 times, in particular 50 times to 70 times, along the outline. Hence, cutting with preferably 50 to 70 rounds or loops around the outline ensures that the stack can be reliably prevented from heating up excessively so that in particular undesired carbonization may be strongly suppressed. In other embodiments, the number of loops may also be smaller than the mentioned values.

In an embodiment, a wavelength of the laser beam is in a range from 492 nm to 577 nm, in particular in a range from 520 nm to 560 nm. Surprisingly, the laser light in the green wavelength range has turned out to be particularly appropriate to avoid undesired carbonization at the outline sidewall of the laser cut component carrier. In particular when combined with laser pulsing having a pulse length below the nanosecond range, excellent results in terms of accuracy, smoothness and low carbonization at the outline sidewall may be achieved.

In a preferred embodiment, cutting out the component carrier from the stack is carried out by cold ablation. Once an ultrashort laser pulse with a pulse length below 1 ns interacts with organic stack material, it may undergo cold ablation, in which the organic stack material may directly vaporize with almost no heat impact on the remaining stack material. In particular, the concept of cold ablation may denote an ablation process that occurs in organic stack material during the dynamics of a picosecond or femtosecond laser to precisely remove resin material without producing artefacts or excessive heat impact on the residual stack material.

In an embodiment, cutting out the component carrier from the stack is carried out for singularizing of component carrier from a panel. For instance, such a panel may comprise a matrix-like array of component carriers (such as printed circuit boards or integrated circuit substrates) arranged in rows and columns. Manufacturing the component carriers in a batch procedure on panel level may simplify the manufacturing process. However, after completing a manufacturing process or at least part thereof, the individual component carriers may be singularized from the panel, preferably by picosecond laser cutting using pulsed green laser light.

In an embodiment, a thickness of the stack is in a range from 200 µm to 2 mm, in particular in a range from 500 µm to 1 mm. In particular in the mentioned range of thicknesses, it has turned out to be possible to obtain excellent results in terms of outline sidewall smoothness and efficient suppression of carbonization while at the same time achieving a quick separation of the individual component carriers with high throughput on an industrial scale.

In an embodiment, reinforcing structures, in particular reinforcing glass fibers, of the at least one electrically insulating layer structure of the stack are in flush with the outline sidewall. In other words, it is possible that said reinforcing structures do not extend laterally beyond the outline sidewall along the circumference of the stack. Electrically insulating layer structures of the stack may have heterogeneous material properties. For instance, they may comprise a resin matrix (for instance made of epoxy resin) in which reinforcing particles (such as glass fibers) may be embedded, which may constitute for instance FR4 material. When laser cutting such a stack material, the burning rate of the resin material may significantly differ from the burning rate of the glass material. Consequently, conventional laser cutting procedures of singularizing printed circuit boards may suffer from fiber ends protruding beyond resin material at an outline sidewall. This may conventionally result in inaccurate, undefined and highly rough outline sidewalls. Incompletely laser processed material at such an outline sidewall may furthermore be prone to highly undesired carbonization phenomena.

In an embodiment, an outline sidewall of the stack has a roughness Rz (or alternatively a roughness Ra) of not more than 15 µm, preferably of not more than 10 µm. In particular when combining green laser light (more particularly in a wavelength range from 520 nm to 560 nm) with laser pulses with a pulse length below 1 ns (in particular below 100 ps), such ultra-smooth side surfaces may be obtained along an entire outline of the fully circumferentially laser cut component carrier.

In an embodiment, a spatial range (in particular a thickness of a sidewall coating) of carbonization at the outline sidewall is less than 100 µm, in particular less than 50 µm. In other words, a thickness of a layer of carbon black resulting from an incomplete burning of organic dielectric stack material may be below 100 µm or even less. In particular, such a carbon black or other kind of carbonization contamination will then not further spread in the horizontal plane and/or on top of the panel beyond 100 µm. Carbonization may particularly denote a blackish burning artifact on a surface of a component carrier comprising organic dielectric material, said blackish burning artifact comprising solid carbon material and/or carbon compounds. Descriptively speaking, such a carbonization may be the result of organic dielectric component carrier material being not fully oxidized to carbon dioxide, but only partially oxidized to a solid carbon compound which has in many cases a black color. Remaining carbon black or the like may then cover a surface, in particular a sidewall, of the component carrier and may cause undesired phenomena there. Furthermore, the gas produced by carbonization may have a substantial content of carbon monoxide which is poisonous when breathed by an operator.

Preferably, the outline sidewall of the stack may be entirely free of carbonization. In particular when combining green laser light (in particular in a wavelength range from 520 nm to 560 nm) with laser pulses with a pulse length below 1 ns (in particular below 100 ps), such a carbonization-free side surface may be obtained.

In an embodiment, a horizontal tapering of the outline sidewall is less than 25 µm, in particular less than 20 µm, particularly less than 15 µm. When using ultra-short pulses of laser light and/or green laser light for singularizing a component carrier from a stack, a deviation of a sidewall of the outline sidewall from a vertical extension may be very small. This may have a positive impact on the accuracy of the definition of the component carrier, as well as the space consumption of the component carrier in the horizontal plane.

In an embodiment, a spatial tolerance at the outside edge is less than 15 µm. In particular, when a lot of component carriers singularized from the same panel is compared, variations between the various component carriers at their outline sidewalls may be below 15 µm. Thus, the component carriers can be manufactured in compliance with even strict specifications.

In an embodiment, the component carrier is configured as one of the group consisting of a rigid component carrier, a rigid-flex component carrier, a semiflexible component carrier, and a flexible component carrier. For instance, a rigid-flex component carrier may comprise a fully flexible portion, for instance made of polyimide (for instance having an ultimate strain of about 70%). In such an embodiment, the material of the flexible portion may be different from the material of one or more adjacent rigid portions, and the material of the flexible portion may be specifically selected to have high elasticity or flexibility. In another example, the component carrier may be a semi-flex component carrier with a semi-flexible portion, for instance made of FR4 material. In such a configuration, the semi-flexible portion may be made of the same material as one or two adjacent rigid portions, but may for instance only have a locally smaller thickness than the connected rigid portion(s). In such a configuration, bendability of the flexible portion only results from the reduced thickness rather than from a more flexible material in the flexible portion. In particular for such partially rigid and partially flexible component carriers, the precise definition of an outline may be highly advantageous, since such partially rigid and partially flexible component carriers may be bent into a configuration to fit into a precisely defined mounting space. Thus, exemplary embodiments may be applied particularly advantageously to partially rigid and partially flexible component carriers, i.e. to rigid-flex component carriers or semi-flexible component carriers. However, in other embodiments, the component carrier may also be entirely flexible or completely rigid.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal, and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as rein-forced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon), a ceramic, and a metal oxide. Reinforcing structures such as webs, fibers, or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
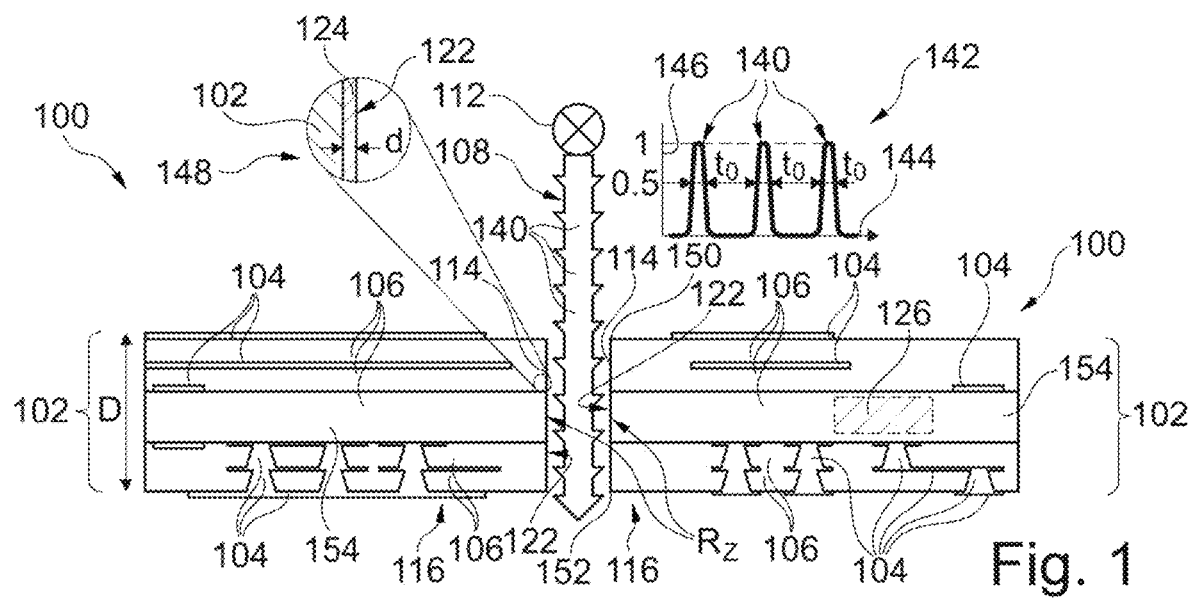
FIG. 1 illustrates a cross-sectional view of a picosecond laser cutting process for defining an outline of component carriers according to an exemplary embodiment of the invention.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

Conventionally, outline formation of component carriers such as printed circuit boards (PCB) may be carried out by routing or using a dicing process. Some systems are also using laser cutting. However, such conventional approaches to not provide sufficient accuracy, may result in rough and undefined outline sidewalls and may also result in highly undesirable accumulation of carbonization at a cutting sidewall. Furthermore, such conventional processes may be incompatible with tough requirements in terms of high yield singularization throughput on an industrial scale.

According to a preferred embodiment of the invention, singularization of component carriers (for instance printed circuit boards) from a stack (such as a panel) may be carried out with a pulsed laser beam having a pulse length below 1 ns and in particular in the picosecond range and/or by using green laser light. It has turned out that such an architecture may result in highly precise component carriers with smooth and well-defined outline sidewalls. Advantageously, any tendency of carbonization at an outline sidewall may be strongly suppressed. The mentioned concept of laser cutting is in line with even demanding requirements concerning high throughput and high yield.

According to an exemplary embodiment of a first aspect of the invention, a printed circuit board (PCB) outline cutting is accomplished with a picosecond-controlled laser system. More particularly, an architecture is provided which utilizes a picosecond pulsed laser to cut the outline of the PCB outline. When PCB industry is moving towards more advanced and tight designs and tolerances, conventional routing or dicing is no longer appropriate for high-performance outline processing. To overcome such shortcomings, an exemplary embodiment provides a method of utilizing a highly advanced picosecond-controlled laser cutting architecture to form the PCB outline with high accuracy and to create an extraordinarily low roughness outline accordingly. Hence, a laser system implementing extremely short laser pulses is provided to reach ultra-high cutting quality outline performance for PCBs and other component carriers (such as IC substrates). Advantageously, an improved outline processing capability with proper throughput and high accuracy at reasonable effort is provided to a PCB designer. Such an embodiment is highly appropriate to provide an advanced level of packaging substrates and embedded packages.

According to an exemplary embodiment of a second aspect of the invention, a printed circuit board (PCB) outline cutting is provided which allows to obtain a substantially carbonization-free PCB outline. This may be obtained by laser cutting using a green light laser. Such a laser cutting architecture provides a PCB manufacturing system with green laser cutting, which allows to obtain a component carrier being reliably prevented from suffering from damage or carbonization of resin and glass cloth of one or more dielectric layer structures of the stack or panel. As mentioned above, a conventional routing process may be not accurate enough to support the outline processing when demanding specifications in terms of tolerances of a manufactured component carrier need to be complied with. By executing laser cutting using green laser light, it may be possible to provide high-end processing of the component carrier. In contrast to conventional approaches of laser cutting causing extensive carbonization on the PCB edge and in the cutting area, a green laser-based laser cutting of a component carrier along its outline may enable a high-quality cutting with fast speed. This may allow to obtain an increased accuracy and a more efficient utilization of the panel. Hence, exemplary embodiments of the invention allow to provide a damage- and carbonization-free high quality component carrier by implementing green laser cutting. As a result, an outline processing technology for component carriers may be provided that can be used across very different PCB applications. Consequently, singulation of panels into PCBs may be significantly improved by exemplary embodiments of the invention. In particular, an exemplary embodiment of the invention may allow to form a carbonization-free laser cut by using a green laser (in particular a laser having a wavelength in a range from 520 nm to 560 nm).

In addition, one or more of the following further improvements may be optionally implemented by which heat accumulation in the stack may be further suppressed. In combination with the green wavelength and/or laser pulsing low 1 ns, a laser irradiation pausing time, a pulse rate, a pulse energy, and/or the supply of inert gas may be considered.

For example, a pulse rate may be, in an exemplary embodiment of the invention, in a range from 200 kHz to 2000 kHz, in particular in a range from 400 kHz to 1000 kHz. According to an embodiment, an impact energy on a panel may be in a range from 3 µJ/pulse to 150 µJ/pulse (in particular in a range from 20 µJ/pulse to 50 µJ/pulse per laser head). In an embodiment, a laser power (i.e. the power of the laser beam) may be in a range from 1 W to 120 W. For instance, the power may be in a range from 10 W to 30 W per laser head, i.e. in a range from 20 W to 60 W upon implementing two laser heads.

FIG. 1 illustrates a cross-sectional view of a picosecond laser cutting process for defining an outline 114 of component carriers 100 according to an exemplary embodiment of the invention.

The cross-sectional view of FIG. 1 comprises a laminated layer stack 102 composed of electrically conductive layer structures 104 and electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin) with reinforcing particles therein (for instance glass fibers or glass spheres). For instance, the electrically insulating layer structures 106 may be made of prepreg or FR4 or build-up film such as ABF. The layer structures 104, 106 may be connected by lamination, i.e. the application of pressure and/or heat.

The stack 102 shown in FIG. 1 can be manufactured and processed on panel-level, i.e. for multiple cards or component carriers 100 to be manufactured in common. After such an efficient batch manufacture, the panel-level stack 102 may be separated or singularized into individual component carriers 100, which is accomplished by an exemplary embodiment of the invention by pulsed laser cutting using extremely short laser pulses. In other words, cutting out the component carriers 100 from the stack 102 is carried out for singularizing of the component carriers 100 from panel 116. As a result, plate-shaped laminate-type component carriers 100 may be obtained, which are here embodied as printed circuit boards (PCBs). Alternatively, the component carriers 100 may be integrated circuit (IC) substrates.

In the shown embodiment, a component 126 (for instance a semiconductor chip such as a silicon die) is embedded in the stack 102, more precisely in a core 154 of stack 102. Core 154 may be made of fully cured dielectric material, such as FR4, which may be partially covered by patterned copper foils on both opposing main surfaces. Due to the fundamentally different material properties of the component(s) 126 (predominantly semiconductor material) on the one hand and of the stack 102 (for instance copper, resin and glass), including significantly different properties in terms of the coefficient of thermal expansion (CTE), it is of utmost importance that separation of the component carriers 100 is accomplished with limited energy impact on the stack 102 with its embedded components 126 to keep thermal stress, warpage and other undesired phenomena small.

Referring now to FIG. 1 in further detail, the illustrated component carriers 100 may be manufactured by laminating stack 102 composed of the shown electrically conductive layer structures 104 and the depicted electrically insulating layer structures 106. One or more components 126 may be optionally embedded in the stack 102 using methods which are known as such by a person skilled in the art of PCB technology.

After processing stack 102 on panel-level in the described way, each individual component carrier 100 may be out from the stack 102 by moving a pulsed laser beam 108, created by a laser source 112, along an interior trajectory of the stack 102, so that a respective component carrier 100 is separated from the rest of the stack 102 along an exterior component carrier outline 114 corresponding to the trajectory of the laser beam 108. Highly advantageously, the component carrier 100 may be cut out from the previously continuous stack 102 by a continuous laser cutting procedure along a closed circumferential laser cutting trajectory or path (as can be taken for instance from FIG. 11). This avoids artifacts and results in a continuous smooth outline 114 with homogeneous properties. As will be understood by a person skilled in the art, moving the pulsed laser beam 108 along the exterior outline 114 of the component carrier 100 may be accomplished by moving a corresponding laser source 112 relative to the stack 102, or by keeping laser source 112 stationary and moving only the laser beam 108 (for instance using one or more appropriate laser-optical elements, not shown).

Highly preferably, a pulse length t0 of each individual of a sequence of laser pulses 140 may be significantly less than 1 ns, for instance may be 10 ps. This can be taken from a diagram 142 shown in FIG. 1. Diagram 142 has an abscissa 144 along which the time is plotted. Along an ordinate 146 of the diagram 142, an amplitude (such as energy, intensity or power) of the laser beam 108 plotted. Pulse length t0 may be the temporal duration of a full width half maximum (FWHM) of a laser pulse 140.

Most preferably, the laser beam 108 may be generated by a picosecond laser source 112, i.e. a laser source 112 configured for emitting pulses 140 with a pulse length t0 in the picosecond range. As can be taken from a detail 148 of an outline sidewall 122, i.e. a sidewall of the component carrier 100 at which sidewall the stack 102 is separated by the laser beam 108, the entire outline sidewall 122 may be substantially vertical, may be covered (if at all) only by a very thin layer of carbonization 124 and shows a low roughness Rz of below 20 µm. For instance, a spatial range (i.e. a thickness d) of carbonization 124, for instance carbon black, at the outline sidewall 122 is less than 50 µm. Without wishing to be bound to a specific theory, it is presently believed that the extremely small pulse length t0 of the picosecond laser beam 108 efficiently focuses the energy impact on the very short laser pulses 140, which precisely cuts the stack 102 into the individual component carriers 100 by cold ablation and without excessive energy impact on the stack 102 apart from the cutting lines. The cutting lines are furthermore of very limited lateral extension, so that a large percentage of the area of the stack 102 may be used for singularizing component carriers 100 with low loss of material. Furthermore, thermal artefacts on the component carriers 100 can be efficiently suppressed. Apart from this, the accuracy of the definition of the component carriers 100 is very high. Highly advantageously, the outline sidewalls 122 are well defined and can be set precisely.

Although it may be in general possible to generate the laser beam 108 by a laser source 112 being embodied as a UV laser or a carbon dioxide laser, the use of a green laser beam 108 is highly preferred, as will be described below referring to FIG. 5. In particular the synergetic combination of picosecond pulses 140 with a green wavelength of laser beam 108 preferably in the range from 520 nm to 560 nm allows obtaining excellent results in terms of quality of outline sidewalls 122 and avoidance of artefacts of the component carrier 100 resulting from excessive heat impact.

Advantageously, excellent results can be obtained when cutting out the component carriers 100 from the stack 102 by moving the pulsed laser beam 108 multiple times (preferably 50 times to 70 times) along the outline 114 of one component carrier 100 for continuously deepening a laser-formed groove in the stack 102 which finally results in the separation of the component carrier 100 when the groove turns into a through hole. It is believed that this approach furthermore suppresses undesired local hotspots and additionally contributes to the quality of the outline sidewalls 122 and the protection of the stack 102 against thermal artefacts.

A thickness D of the stack 102 may be in particular in a range from 500 µm to 1 mm, for instance 650 µm. Such a thickness D also allows to further promote the quality of the laser separation.

Figure 3:
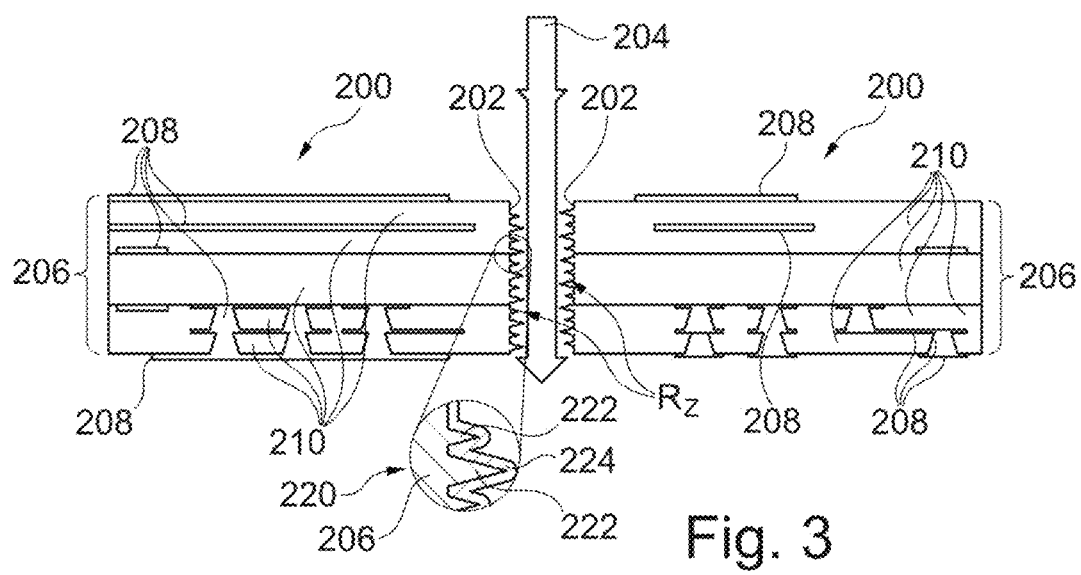
FIG. 3 illustrates a cross-sectional view of a conventional nanosecond laser cutting process for defining an outline of component carriers.

Also referring to FIG. 3 for comparison purposes, reinforcing structures such as a glass cloth composed of glass fibers 222 of the electrically insulating layer structures 106 of the stack 102 is in flush with the outline sidewall 122 according to FIG. 1. In other words, said fiber-type reinforcing structures do not extend laterally beyond the outline sidewall 122 along the circumference of the stack 102, which further increases the smoothness of the sidewall.

As a result of the accurate formation of the outline sidewall 122 according to FIG. 1, a horizontal tapering of the outline sidewall 122 may be preferably less than 15 µm. Descriptively speaking, this means that a lateral (i.e. horizontal according to FIG. 1) offset between an upper corner 150 and a lower corner 152 of a respective component carrier 100 is less than 15 µm. Advantageously, a spatial tolerance at the outline sidewall 122 may be less than 25 µm, less than 20 µm or even less than 15 µm thanks to the accurate definition of the cutting process by the picosecond pulsed laser beam 108.

Figure 2:
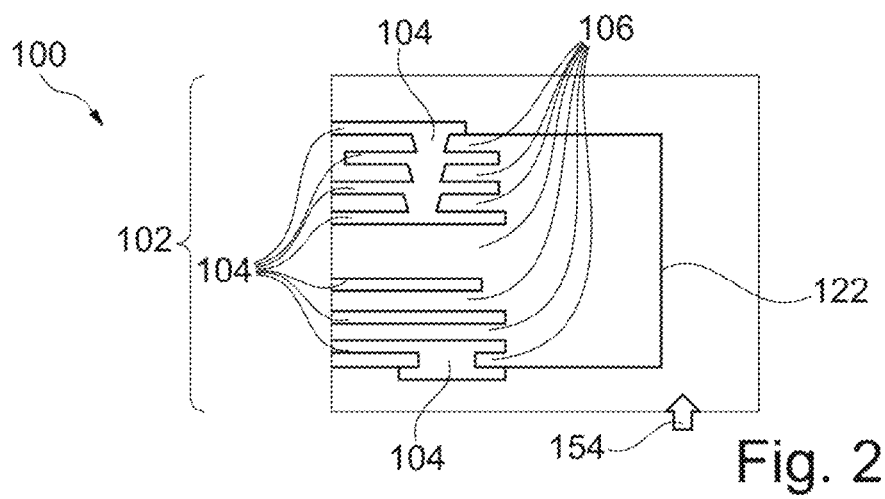
FIG. 2 illustrates a cross-sectional view of a sidewall of a component carrier cut by a picosecond laser for defining an outline of the component carrier according to an exemplary embodiment of the invention.

FIG. 2 illustrates a cross-sectional view of a sidewall of a component carrier 100 cut by a picosecond laser beam 108 for defining an outline sidewall 122 of the component carrier 100 according to an exemplary embodiment of the invention. The image of FIG. 2 shows the cross section of an image of a manufactured component carrier 100 and in particular illustrates a laser entry side with reference sign 154.

FIG. 3 illustrates a cross-sectional view of a conventional nanosecond laser cutting process for defining an outline sidewall 202 of component carriers 200.

Each of the component carriers 200 of FIG. 3 comprises a stack 206 made of electrically conductive layer structures 208 and electrically insulating layer structures 210. The component carriers 200 of FIG. 3 are separated from a panel using a microsecond or nanosecond pulsed laser beam 204.

As shown, the outline sidewall 202 of the component carriers 200 are very rough with an Rz value much larger than 20 μm. Furthermore, as shown by a detail 220, glass fibers 222, which are improperly cut by the microsecond or nanosecond pulsed laser beam 204 protrude in a pronounced way at the outline sidewall 202 of the stack 206. Furthermore, due to an incomplete burning of the organic material of the electrically insulating layer structures 210 by the microsecond or nanosecond pulsed laser beam 204, a significant amount of carbon black may accumulate in an uncontrolled way at the outline sidewall 202 to thereby form a pronounced carbonization 224 of uncontrolled and large thickness.

As described above, the mentioned shortcomings may be overcome by the embodiment of FIG. 1.

Figure 4:
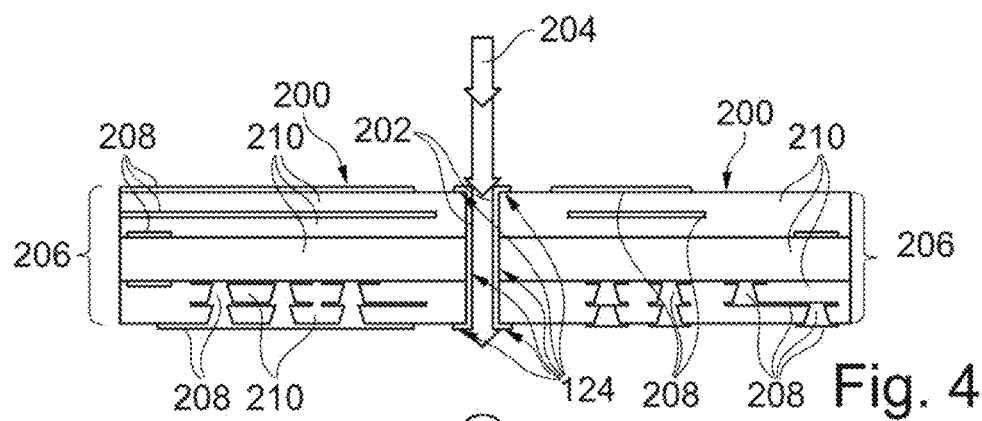
FIG. 4 illustrates a cross-sectional view of a conventional carbon dioxide laser cutting process for defining an outline of component carriers.

FIG. 4 illustrates a cross-sectional view of a conventional carbon dioxide laser cutting process for defining an outline sidewall 202 of component carriers 200.

FIG. 4 shows the scenario of component carriers 200 singularized by a carbon dioxide laser operating with microsecond or nanosecond pulses. As shown, a pronounced degree of carbonization 124 occurs at the obtained outline sidewalls 202. Incomplete burning at the outline sidewalls 202 and a disadvantageous laser energy impact on the stack 206 as a whole may result in component carriers 200 which have only limited reliability. The mentioned carbon dioxide laser may emit laser light in the infrared regime, for instance in a range from 900 nm to 1200 nm.

Figure 5:
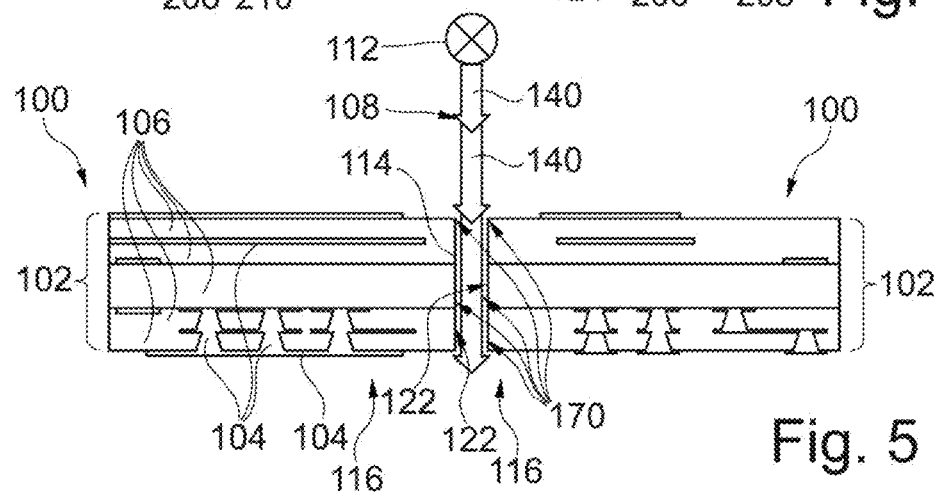
FIG. 5 illustrates a cross-sectional view of component carriers cut by a green laser for defining an outline of the component carriers according to an exemplary embodiment of the invention.

FIG. 5 illustrates a cross-sectional view of component carriers 100 with outline sidewalls 122 cut by a green laser source 112 emitting a green laser beam 108 for precisely defining an outline 114 of the component carriers 100 according to an exemplary embodiment of the invention.

Advantageously, the component carriers 100 shown in FIG. 5 are separated from the stack 102 by a green laser beam 108. Said green laser beam 108 may operate at a wavelength in a range from 492 nm to 577 nm, and preferably in a range from 520 nm to 560 nm. It is believed that, in particular in comparison with FIG. 4, the more energetic green laser beam 108 ensures substantially complete burning of organic stack material at the outline sidewalls 122, which may be therefore free or substantially free of carbonization (as illustrated schematically by reference sign 170).

Although the pulsed green laser beam 108 may also operate in the microsecond or nanosecond range of pulse lengths t0, it may be preferred that the green-light laser beam 108 is a pulsed laser beam 108 emitting laser pulses 140 with pulse lengths t0 of less than 1 ns, most preferably in the picosecond range. As a result, excellent properties may be obtained at the outline sidewalls 122 in terms of suppression of carbonization, smoothness of the sidewalls, vertical extension of the sidewalls, and low tolerances.

Figure 6:
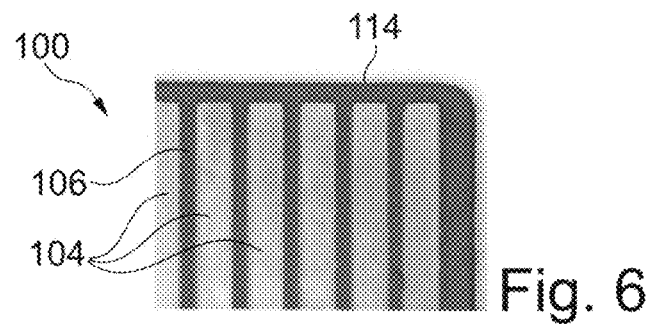
FIG. 6 illustrates a plan view of an edge portion of a rigid-flex component carrier cut by a green picosecond laser for defining an outline of the component carrier according to an exemplary embodiment of the invention.

FIG. 6 illustrates a plan view of an edge portion of a component carrier 100 cut by a green picosecond laser beam 108 for defining an outline 114 of the component carrier 100 according to an exemplary embodiment of the invention. The shown embodiment relates to a rigid-flex component carrier 100. Without wishing to be bound to a specific theory, it is presently believed that the implementation of a green picosecond laser beam 108 for outline cutting component carriers 100 results in a cutting process which is dominated by a cold ablation. Consequently, artefacts at the outline 114 may be safely prevented.

Figure 7:
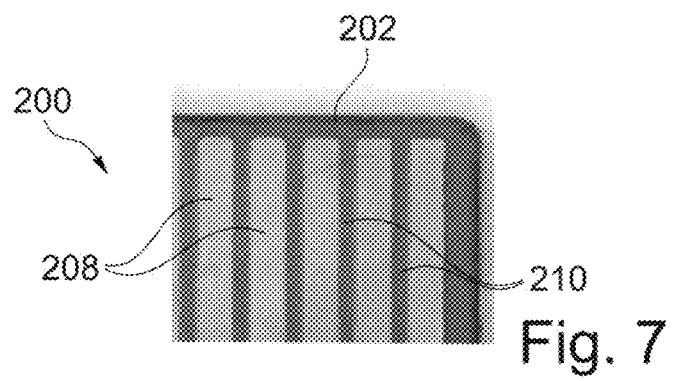
FIG. 7 illustrates a plan view of an edge portion of a component carrier cut conventionally by a nanosecond laser for defining an outline of the component carrier.

FIG. 7 illustrates a plan view of an edge portion of a component carrier 200 cut conventionally by a UV nanosecond laser for defining an outline of the component carrier 200. As shown, the outline sidewall 202 is significantly less defined as compared to the outline 114 of the component carrier 100 of FIG. 6. Without wishing to be bound to a specific theory, it is presently believed that an excessive heat impact on the component carrier 200 results in heat affect artefacts in particular at the outline sidewall 202.

Figure 8:
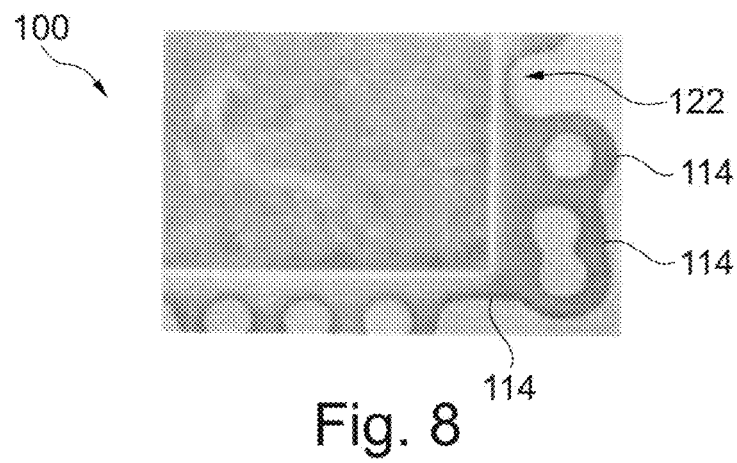
FIG. 8 illustrates a plan view of an edge portion of a component carrier cut by a picosecond laser for defining an outline of the component carrier according to an exemplary embodiment of the invention.

FIG. 8 illustrates a plan view of an edge portion of a component carrier 100 cut by a picosecond laser beam 108 for defining an outline sidewall 122 of the component carrier 100 according to an exemplary embodiment of the invention. The illustration of FIG. 8 shows that that the outline 114 may be precisely defined when singularizing a component carrier 100 from a panel-type stack 102 using a picosecond laser. In particular, straight and low-roughness sidewalls may be obtained.

Figure 9:
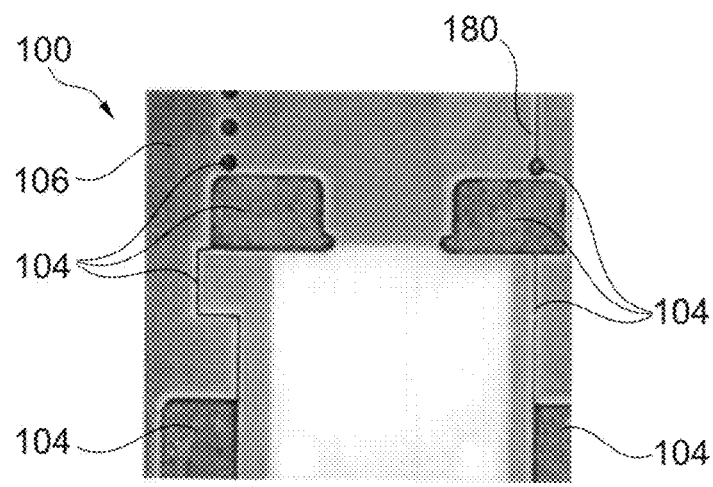
FIG. 9 illustrates a plan view of a portion of a component carrier cut by a green picosecond laser for defining an outline of the component carrier according to an exemplary embodiment of the invention.

FIG. 9 illustrates a plan view of a portion of a component carrier 100 cut by a green picosecond laser for defining an outline 114 of the component carrier 100 according to an exemplary embodiment of the invention. Due to cold ablation occurring when using a green picosecond laser 108 for cutting a flexible component carrier 100, an artefact-free component carrier 100 may be obtained. This can be seen in particular when comparing a portion 180 of the component carrier 100 according to FIG. 9 with a portion 230 shown in FIG. 10.

Figure 10:
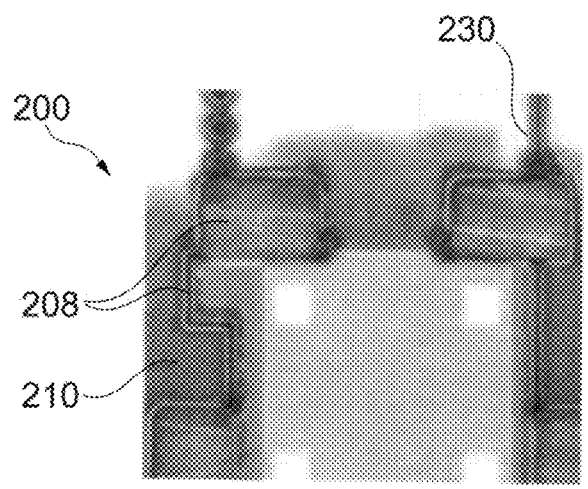
FIG. 10 illustrates a plan view of an edge portion of a component carrier cut conventionally by a UV nanosecond laser for defining an outline of the component carrier.

FIG. 10 illustrates a plan view of a portion of a component carrier 200 cut conventionally by a UV nanosecond laser for defining an outline of the component carrier 200. Undesired heat affects may be seen particularly around reference sign 230 of FIG. 10.

Figure 11:
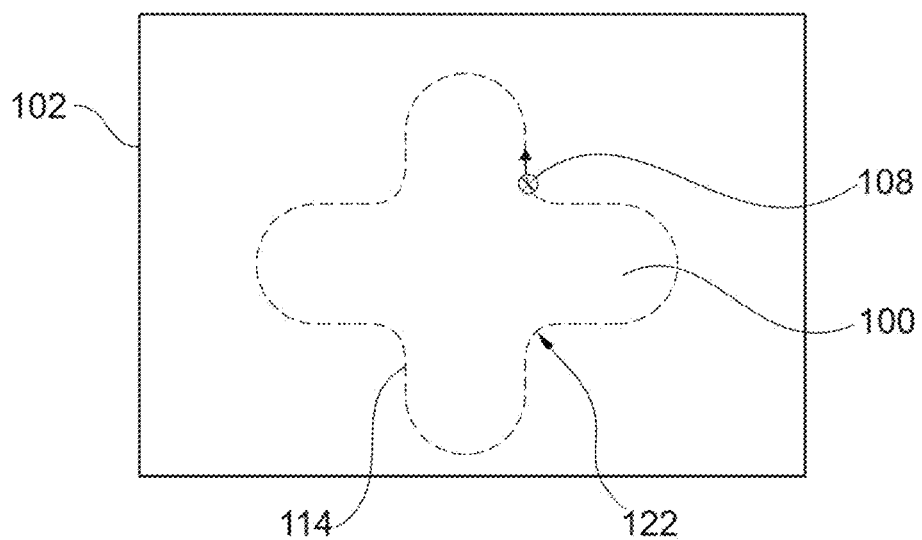
FIG. 11 illustrates a plan view of a component carrier structure out of which a component carrier is cut out by a green picosecond pulsed laser for defining an outline of the component carrier by carrying out a plurality of sequential circumferential cutting stages.

FIG. 11 illustrates a plan view of a panel-type component carrier structure, in form of a laminated layer stack 102, out of which a component carrier 100 is cut out by a green picosecond pulsed laser beam 108 for defining an outline 114 of the component carrier 100 by carrying out a plurality of sequential circumferential cutting stages.

More specifically, the method according to FIG. 11 comprises cutting out the component carrier 100 from the stack 102 by moving the laser beam 108 multiple times along the outline 114 of the component carrier 100 to be singularized in closed loops. Preferably, cutting out the component carrier 100 from the stack 102 may be accomplished by moving the laser beam 108 about 50 times to about 70 times in closed loops along the outline 114. Descriptively speaking, a circumferentially closed groove may be formed in the stack 102 which is continuously deepened at each revolution or loop of the laser beam 108 until the groove turns into or is converted into a through hole when the component carrier 100 is separated from the stack 102. With such an architecture, an energy impact on the stack 102 during singularization may be kept reasonably low, which results in excellent surface properties of the outline sidewall 122 of the separated component carrier 100.

It is believed that such a cutting protocol reliably prevents the stack 102 from overheating and from the formation of local hot spots which may cause undesired artefacts. Best results can be obtained by using laser pulses shorter than 1 nm, irradiating the stack 102 with green light, and cutting in a plurality of closed loops. Under these circumstances, cold ablation may be ensured.

Figure 12:
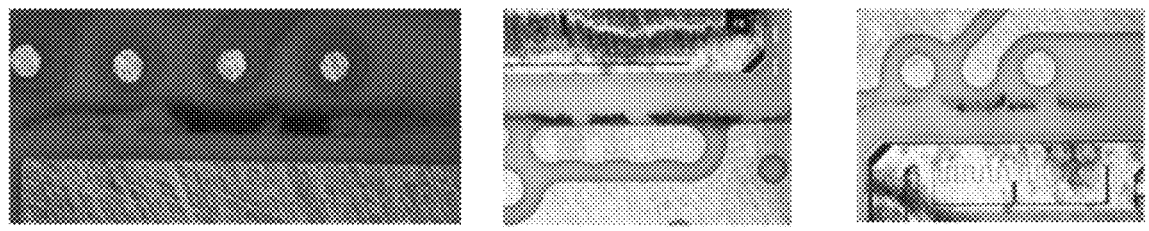
FIG. 12 shows plan views of portions of a conventionally processed component carrier with pronounced carbonization.

FIG. 12 shows plan views of portions of a conventionally processed component carrier with pronounced carbonization. FIG. 12 shows performance with nanosecond laser processing resulting in a heavy heating and carbonization effect. The carbonization may extend over an area of for example about 200 μm or more from the cutting line.

Figure 13:
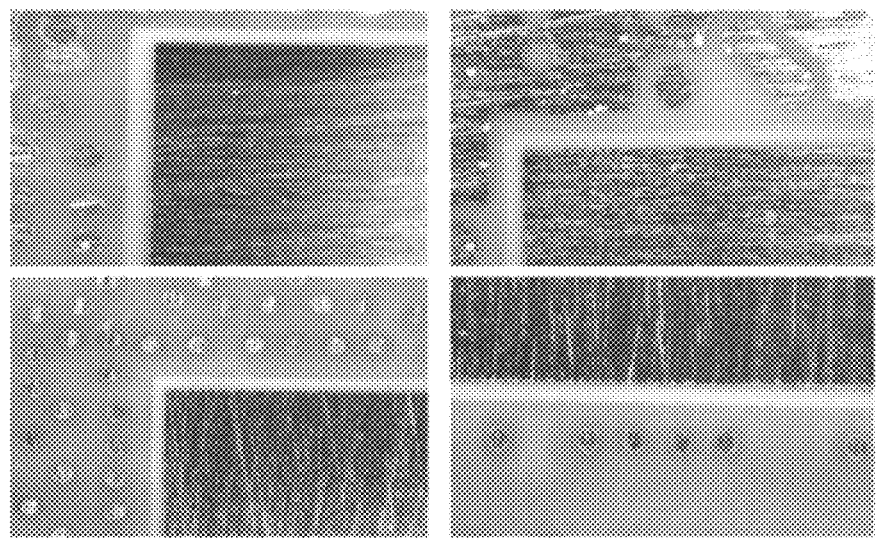
FIG. 13 shows plan views of portions of a component carrier manufactured according to an exemplary embodiment of the invention without visible carbonization.

FIG. 13 shows plan views of portions of a component carrier manufactured according to an exemplary embodiment of the invention without visible carbonization. FIG. 13 shows a component carrier corresponding to the component carrier of FIG. 12, however implementing a picosecond laser cutting process. No carbonization is visible.

It should be noted that the term "comprising" does not exclude other elements or steps and the use of article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing a component carrier, the method comprising:
    forming a stack comprising at least one electrically conductive layer structure and/or at least one electrically insulating layer structure, wherein the at least one electrically insulating layer structure comprises a resin matrix in which reinforcing particles are embedded; and
    cutting out the component carrier from the stack along a closed circumferential laser cutting trajectory by a pulsed laser beam having a pulse length of less than 1 ns,
    wherein an entire outline sidewall of the stack has a roughness Rz of not more than 20 μm,
    wherein the component carrier is one of a printed circuit board, an organic interposer, and an integrated circuit substrate.

2. The method according to claim 1, wherein the laser beam is a green laser beam or an ultraviolet laser beam.

3. The method according to claim 1, wherein the pulsed laser beam has a pulse length in a temporal range from 1 ps to 100 ps.

4. The method according to claim 1, wherein the pulsed laser beam has a pulse length of not more than 10 ps.

5. The method according to according to claim 1, wherein the method comprises generating the laser beam by a picosecond laser source.

6. The method according to according to claim 1, wherein the method comprises cutting out the component carrier from the stack by moving the laser beam multiple times along an outline of the component carrier in closed loops.

7. The method according to according to claim 1, wherein the method comprises cutting out the component carrier from the stack by moving the laser beam 10 times to 100 times.

8. The method according to according to claim 1, wherein a wavelength of the laser beam is in a range from 492 nm to 577 nm.

9. The method according to according to claim 1, wherein a wavelength of the laser beam is in a range from 50 nm to 650 nm.

10. The method according to according to claim 1, wherein cutting out the component carrier from the stack is carried out for singularizing of component carriers from a panel.

11. The method according to according to claim 1, wherein cutting out the component carrier from the stack is carried out by cold ablation.

12. A method of manufacturing a component carrier, the method comprising:
    forming a stack comprising at least one electrically conductive layer structure and/or at least one electrically insulating layer structure, wherein the electrically insulating layer structure comprises a resin matrix in which reinforcing particles are embedded; and
    cutting out the component carrier from the stack along a closed circumferential laser cutting trajectory by a green laser beam,
    wherein an entire outline sidewall of the stack has a roughness Rz of not more than 20 μm,
    wherein the component carrier is one of a printed circuit board, an organic interposer, and an integrated circuit substrate.

13. The method according to claim 12, wherein the laser beam is a pulsed laser beam having a pulse length of less than 1 ns.

14. A component carrier, comprising:
    a stack comprising at least one electrically conductive layer structure and/or at least one electrically insulating layer structure, wherein the electrically insulating layer structure comprises a resin matrix in which reinforcing particles are embedded;
    wherein an entire outline sidewall of the stack has a roughness Rz of not more than 20 μm,
    wherein the component carrier is one of a printed circuit board, an organic interposer, and an integrated circuit substrate.

15. The component carrier according to claim 14, comprising at least one of the following features:
    wherein a thickness of the stack is in a range from 200 μm to 2 mm;
    wherein reinforcing structures of the at least one electrically insulating layer structure of the stack do not extend laterally beyond the outline sidewall along the outline of the stack;
    wherein the outline sidewall of the stack has a roughness Rz of not more than 15 μm;
    wherein a spatial range of a carbonization at the outline sidewall is less than 100 μm;
    wherein the outline sidewall of the stack is free of carbonization.

16. The component carrier according to claim 14, wherein a tapering of the outline sidewall in a horizontal direction is less than 25 μm.

17. The component carrier according to claim 14, wherein the component carrier comprises a component embedded in the stack.

18. The component carrier according to claim 17, wherein the component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

19. The component carrier according to claim 14, configured as one of the group consisting of a rigid component carrier, a rigid-flex component carrier, a semiflexible component carrier, and a flexible component carrier.

20. The component carrier according to claim 14, comprising at least one of the following features:
- wherein the at least one electrically conductive layer structure comprises at least one of the group consisting of copper, aluminum, nickel, silver, gold, palladium, and tungsten;
- wherein the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
- wherein the component carrier is shaped as a plate;
- wherein the component carrier is configured as a laminate-type component carrier.

* * * * *